US011232965B2

(12) United States Patent
Newman et al.

(10) Patent No.: US 11,232,965 B2
(45) Date of Patent: Jan. 25, 2022

(54) TRANSPORT SYSTEM

(71) Applicant: Applied Materials, Inc., Santa Clara, CA (US)

(72) Inventors: Jacob Newman, Palo Alto, CA (US); Ulrich Oldendorf, Ober-Ramstadt (DE); Martin Aenis, Darmstadt (DE); Andrew J. Constant, Cupertino, CA (US); Shay Assaf, Gilroy, CA (US); Jeffrey C. Hudgens, San Francisco, CA (US); Alexander Berger, Palo Alto, CA (US); William Tyler Weaver, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 191 days.

(21) Appl. No.: 16/591,456

(22) Filed: Oct. 2, 2019

(65) Prior Publication Data
US 2020/0111692 A1 Apr. 9, 2020

Related U.S. Application Data

(60) Provisional application No. 62/741,265, filed on Oct. 4, 2018.

(51) Int. Cl.
*H01L 21/677* (2006.01)
*B65G 47/92* (2006.01)
(Continued)

(52) U.S. Cl.
CPC ........ *H01L 21/67724* (2013.01); *B65G 47/92* (2013.01); *H01L 21/67167* (2013.01);
(Continued)

(58) Field of Classification Search
CPC ........ H01L 21/67724; H01L 21/67167; B65G 47/92
See application file for complete search history.

(56) References Cited

U.S. PATENT DOCUMENTS 5,180,048 A   1/1993   Kawada et al.
5,641,054 A   6/1997   Mori et al.
(Continued)

FOREIGN PATENT DOCUMENTS

JP   62121134      6/1987
JP   H07117847 A   5/1995
(Continued)

OTHER PUBLICATIONS

International Search Report and the Written Opinion of the International Searching Authority for PCT/US2019/054089 dated Feb. 25, 2020, 13 pages.
(Continued)

*Primary Examiner* — Saul Rodriguez
*Assistant Examiner* — Willie Berry, Jr.
(74) *Attorney, Agent, or Firm* — Patterson + Sheridan LLP

(57) ABSTRACT

Embodiments herein relate to a transport system and a substrate processing and transfer (SPT) system. The SPT system includes a transport system that connects two processing tools. The transport system includes a vacuum tunnel that is configured to transport substrates between the processing tools. The vacuum tunnel includes a substrate transport carriage to move the substrate through the vacuum tunnel. The SPT system has a variety of configurations that allow the user to add or remove processing chambers, depending on the process chambers required for a desired substrate processing procedure.

20 Claims, 12 Drawing Sheets

(51) Int. Cl.
*H01L 21/67* (2006.01)
*H01L 21/687* (2006.01)

(52) U.S. Cl.
CPC .. *H01L 21/67709* (2013.01); *H01L 21/67712* (2013.01); *H01L 21/68707* (2013.01)

(56) References Cited

U.S. PATENT DOCUMENTS

| | | | |
|---|---|---|---|
| 6,206,176 | B1 | 3/2001 | Blonigan et al. |
| 7,293,950 | B2 | 11/2007 | Bonora et al. |
| 7,438,175 | B2 | 10/2008 | White et al. |
| 7,841,820 | B2 | 11/2010 | Bonora et al. |
| 7,948,122 | B2 | 5/2011 | Compter et al. |
| 8,066,466 | B2 | 11/2011 | Rice et al. |
| 8,851,817 | B2 | 10/2014 | Bonora et al. |
| 9,147,592 | B2 | 9/2015 | Englhardt et al. |
| 9,862,554 | B2 | 1/2018 | Caveney |
| 2004/0023495 | A1 | 2/2004 | Butterfield et al. |
| 2006/0285945 | A1* | 12/2006 | Hofmeister ....... H01L 21/67173 414/217 |
| 2007/0002692 | A1 | 11/2007 | Meulen et al. |
| 2007/0269297 | A1 | 11/2007 | Meulen et al. |
| 2008/0175694 | A1 | 7/2008 | Park et al. |
| 2010/0226737 | A1 | 9/2010 | Sakaue et al. |
| 2011/0312189 | A1 | 12/2011 | Kim et al. |
| 2012/0109355 | A1 | 5/2012 | Baccini et al. |
| 2012/0213614 | A1 | 8/2012 | Bonora et al. |
| 2015/0000139 | A1 | 1/2015 | Krupyshev et al. |
| 2015/0013910 | A1 | 1/2015 | Krupyshev et al. |
| 2016/0293467 | A1 | 10/2016 | Caveney et al. |
| 2017/0148651 | A1 | 5/2017 | Kao et al. |
| 2018/0141762 | A1 | 5/2018 | Caveney |
| 2019/0237351 | A1* | 8/2019 | Krupyshev ............ B25J 9/1697 |

FOREIGN PATENT DOCUMENTS

| | | |
|---|---|---|
| JP | H07122616 A | 5/1995 |
| JP | H07172578 A | 7/1995 |
| JP | H07176591 A | 7/1995 |
| JP | 3625127 B2 | 3/2005 |
| KR | 2014/0133534 A | 11/2014 |
| WO | 2007/101228 A2 | 9/2007 |

OTHER PUBLICATIONS

Taiwan Office Action issued to 108135855 dated Nov. 19, 2020.
International Search Report dated Apr. 25, 2016 for Application No. PCT/US2016/012600.

\* cited by examiner

TRANSPORT SYSTEM

CROSS-REFERENCE TO RELATED APPLICATIONS

This application claims priority to U.S. Provisional Patent Application No. 62/741,265, filed Oct. 4, 2018, which is hereby incorporated by reference in its entirety.

FIELD

The present application relates generally to an apparatus and, more specifically, to a transport system.

BACKGROUND

Manufacturing semiconductor devices typically involves performing a sequence of procedures with respect to a substrate or wafer such as a silicon substrate, a glass plate, etc. These steps may include polishing, deposition, etching, photolithography, heat treatment, and so forth. Usually a number of different processing steps may be performed in a single processing system or tool which includes a plurality of processing chambers. However, it is generally the case that other processes are performed at other processing locations within a fabrication facility, and it is accordingly necessary that substrates be transported within the fabrication facility from one processing location to another. Depending on the type of semiconductor device to be manufactured, there may be a relatively large number of processing steps to be performed at many different processing locations within the fabrication facility.

It is conventional to transport substrates from one processing location to another within substrate carriers such as sealed pods, cassettes, containers and so forth. It is also conventional to include automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

Such transport of substrates typically involves exposing the substrates to room air, or at least to non-vacuum conditions. Either may expose the substrates to an undesirable environment (e.g., oxidizing species) and/or contaminants.

Therefore, what is needed is improved transfer systems for transferring substrates between processing tools.

SUMMARY

Embodiments disclosed herein include transport systems and substrate processing and transport (SPT) systems. The transport and SPT systems include vacuum tunnels, carriages, and other features to help protect substrates from undesirable environments.

In one embodiment, a transport system is provided, including a vacuum tunnel configured to interface with a first processing tool and a second processing tool. The vacuum tunnel includes an expanded region, a substrate transport carriage, and a rotary stage disposed in the expanded region. The rotary stage is configured to rotate the substrate transport carriage between about 0 degrees and about 180 degrees. The substrate transport carriage includes a carriage body and an end effector coupled to the carriage body. The end effector is configured to support a substrate during transport within the vacuum tunnel. The end effector is configured to extend into the first or second processing tool to extract or place a substrate while the carriage body remains within the vacuum tunnel.

In another embodiment, a substrate processing and transport (SPT) system is provided, including a first processing tool and a second processing tool, each processing tool includes a transfer chamber configured to couple to one or more processing chambers, a load lock chamber having a first access opening configured to receive a substrate from an equipment front end module, a second access opening configured to transfer substrates to or from the transfer chamber of the first processing tool, and a third access opening, and a vacuum tunnel coupled between the third access opening of the first processing tool and the third access opening of the second processing tool. The vacuum tunnel includes a substrate transport carriage. The substrate support carriage includes a carriage body and an end effector coupled to the carriage body. The end effector is configured to support the substrate during transport within the vacuum tunnel and to extend into the load lock chambers of the first and second processing tools using the third access opening of each of the first and second processing tools.

In yet another embodiment, a transport system is provided, including a vacuum tunnel configured to extend between a first processing tool and a second processing tool, the vacuum tunnel including a substrate transport carriage, a first elevator unit positioned near the first processing tool so as to allow transport of the substrate transport carriage between the first processing tool and the vacuum tunnel, a second elevator unit positioned near the second processing tool so as to allow transport of the substrate transport carriage between the first processing tool and the vacuum tunnel, and an emergency braking system configured to prevent substrate transport carriage systems within the first or second elevator units from falling during a loss of electrical power. The vacuum tunnel is positioned above the first and second processing tools.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
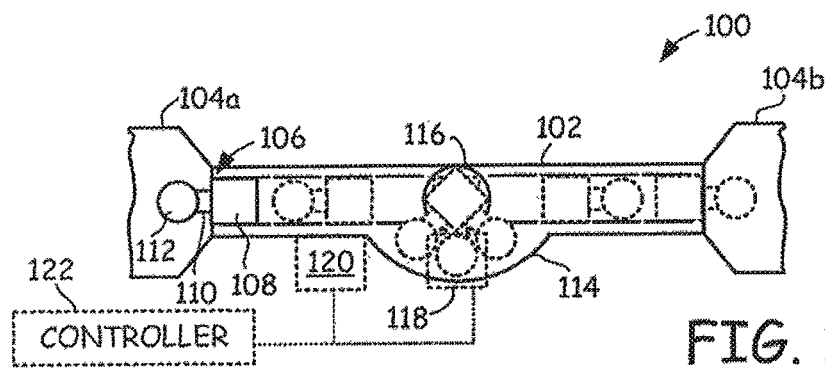
FIGS. 1A-1E illustrate top schematic diagrams of a transport system, according to one embodiment.
Figure 1B:
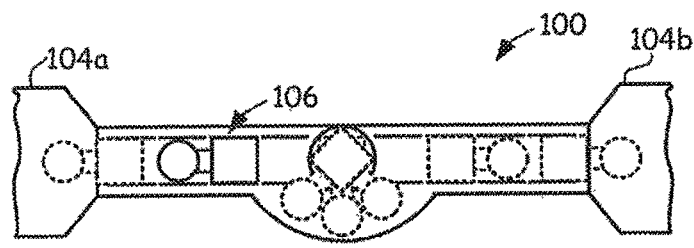
Figure 1C:
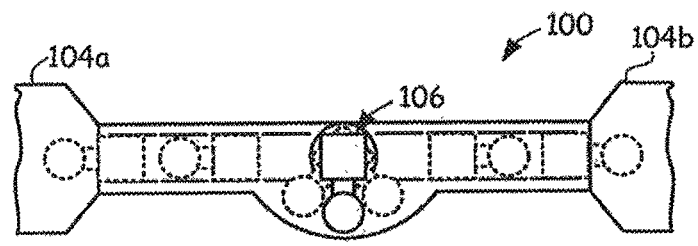
Figure 1D:
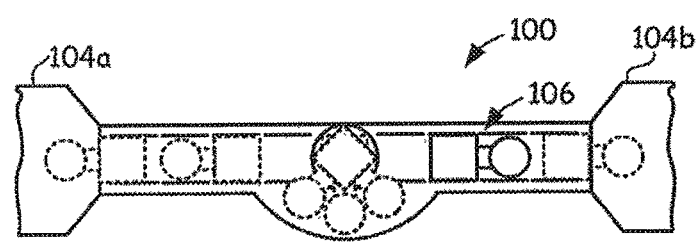
Figure 1E:
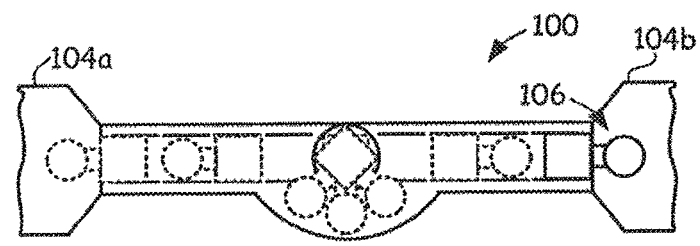

In accordance with embodiments described herein, one or more processing tools are coupled together via one or more vacuum tunnels. Such a system allows substrates to be transported under vacuum to the various chamber locations of multiple processing tools, and effectively increases the number of high vacuum or clean chamber locations (e.g., facets) available. Such processing tools would typically be used as separate, stand-alone processing tools that operate independently of one another.

In some embodiments, substrates are transferred between a load lock chamber of a first processing tool and a load lock chamber of a second processing tool using a vacuum tunnel. For example, substrate transfers are performed at the same height level as the processing tools or at a different elevation (e.g., above the processing tools). In some embodiments, a vacuum tunnel allows metrology and/or inspection to be performed on substrates as the substrates are transported between processing tools. In one or more embodiments, magnetic levitation (maglev) is used to transport substrates within vacuum tunnels between processing tools.

As used herein, the term "about" refers to a +/−10% variation from the nominal value. It is to be understood that such a variation can be included in any value provided herein.

FIGS. 1A-1E illustrate top schematic diagrams of a transport system 100, according to one embodiment. The transport system 100 is configured to transport substrates between multiple processing tools. As shown, the transport system 100 includes a vacuum tunnel 102. The vacuum tunnel 102 is configured to extend between a first processing tool 104a and a second processing tool 104b. The processing tools 104a, 104b can be any suitable processing tools, such as the Endura 2 mainframe available from Applied Materials, Inc. of Santa Clara, Calif., the Centura ACP mainframe, also available from Applied Materials, Inc., or the like. Other processing tools and/or mainframes can be used.

The processing tools 104a, 104b can include processing chambers coupled to transfer chambers, an equipment front end module, load lock chambers, pre-processing chambers and/or the like (described further below). Example processing chambers include deposition chambers (e.g., physical vapor deposition, chemical vapor deposition, plasma enhanced chemical vapor deposition, etc.), etch chambers, degas chambers and/or any other type of processing chambers. Any number of processing chambers can perform the same or different processes.

In general, the vacuum tunnel 102 can couple to an equipment front end module, load lock chamber, transfer chamber, processing chamber or other location of a processing tool. Example vacuum levels for the vacuum tunnel 102 range from about $10^{-10}$ Torr to about 760 Torr, although other vacuum levels can be used.

As shown, the vacuum tunnel 102 includes a substrate transport carriage 106 having a carriage body 108 and an end effector 110 coupled to the carriage body 108. The end effector 110 is configured to support a substrate 112 during transport within the vacuum tunnel 102. The end effector 110 is configured to extend the substrate into the first or second processing tool 104a, 104b to extract or place substrate 112 while the carriage body 108 remains fully or partially within the vacuum tunnel 102. For example, the end effector 110 is of sufficient length to extend into a load lock chamber, processing chamber, transfer chamber or other location within processing tools 104a,104b to receive or place a substrate while the remainder of the substrate transport carriage 106 remains in the vacuum tunnel 102. In some embodiments, the substrate transport carriage 106 is raised or lowered to facilitate substrate transfer to or extraction from processing tool 104a or 104b (e.g., via a z-axis motor, increased magnetic field strength for a maglev system, or the like). In other embodiments, the substrate transport carriage 106 relies on z-axis motion provided by lift pins, robots, etc., within the processing tools 104a and/or 104b during substrate pick up and/or place operations.

In some embodiments, vacuum tunnel 102 includes an expanded region 114 having a rotary stage 116 configured to rotate the substrate transport carriage 106 between a desired angular range (e.g., 0 degrees and 180 degrees in some embodiments). This allows the end effector 110 to be rotated to face either the processing tool 104a or the processing tool 104b. FIGS. 1A-1E illustrate example motion of the substrate transport carriage 106, the end effector 110, and the substrate 112 during transfer of the substrate 112 from the processing tool 104a to the processing tool 104b.

In some embodiments, the transport system 100 includes a metrology or inspection tool 118 positioned relative to the vacuum tunnel 102 so as to allow metrology or inspection on a substrate 112 positioned on the end effector 110 while the substrate transport carriage 106 is rotated by the rotary stage 116. For example, the metrology tool 118 is configured to measure film thickness, film uniformity, substrate defect levels, perform edge inspection, or the like. In other embodiments, the metrology tool 118 is configured for notch finding, substrate realignment, etc. Other metrology and/or inspection tools can be used. In yet other embodiments, the metrology tool 118 or another tool are used for other processes within the expanded region 114 of the vacuum tunnel 102, such as substrate degas, substrate cooling, preclean, etc., operations.

In some embodiments, the transport system 100 includes a magnetic levitation system 120 configured to levitate the substrate transport carriage 106 and move the substrate transport carriage 106 between the first processing tool 104a and the second processing tool 104b. For example, the substrate transport carriage 106 includes a plurality of permanent and/or other magnets that are repelled from permanent and/or other magnets used by a drive mechanism, which in some embodiments is located outside of the vacuum tunnel 102. Electromagnets can be configured to facilitate control of movement and/or positioning of the substrate transport carriage 106. A controller 122, such as one or more microcontrollers, programmable logic controllers, dedicated hardware and/or software, or the like, can be configured to control one or more of operation of the metrology tool 118, the maglev system 120, the vacuum tunnel 102, etc.

In operation, substrate transport carriage 106 can be configured to retrieve the substrate 112 from the first processing tool 104a by extending the end effector 110 from the vacuum tunnel 102 into the processing tool 104a. For example, the end effector 110 extends into a load lock chamber, transfer chamber, processing chamber or the like of the processing tool 104a to retrieve the substrate 112 (e.g., with or without z-direction motion provided by substrate transport carriage 106). Thereafter, the substrate transport carriage 106 travels toward the processing tool 104b, rotating by an appropriate amount within the expanded region 114 so that the end effector 110 is oriented to extend into the processing tool 104b. The substrate transport carriage 106 rotates by approximately 180 degrees so that the end effector 110 faces the processing tool 104b. In other embodiments, in which the processing tools 104a, 104b are not positioned along a straight line, other angles of rotation can be used (e.g., 45, 90, etc. degrees).

During rotation of the substrate transport carriage 106, the metrology tool 118 can perform one or more metrology, inspection or other measurements on the substrate 112. Additionally or alternatively, other processes are performed within the expanded region 114 (e.g., degas, preclean, cooling, etc.).

Once the end effector 110 faces the processing tool 104b, the substrate transport carriage 106 can travel to place the substrate 112 in the processing tool 104b. For example, the end effector 110 extends into a load lock chamber, transfer chamber, processing chamber or the like of the processing tool 104b to place the substrate 112 therein (e.g., with or without z-direction motion provided by the substrate transport carriage 106).

Figure 2:
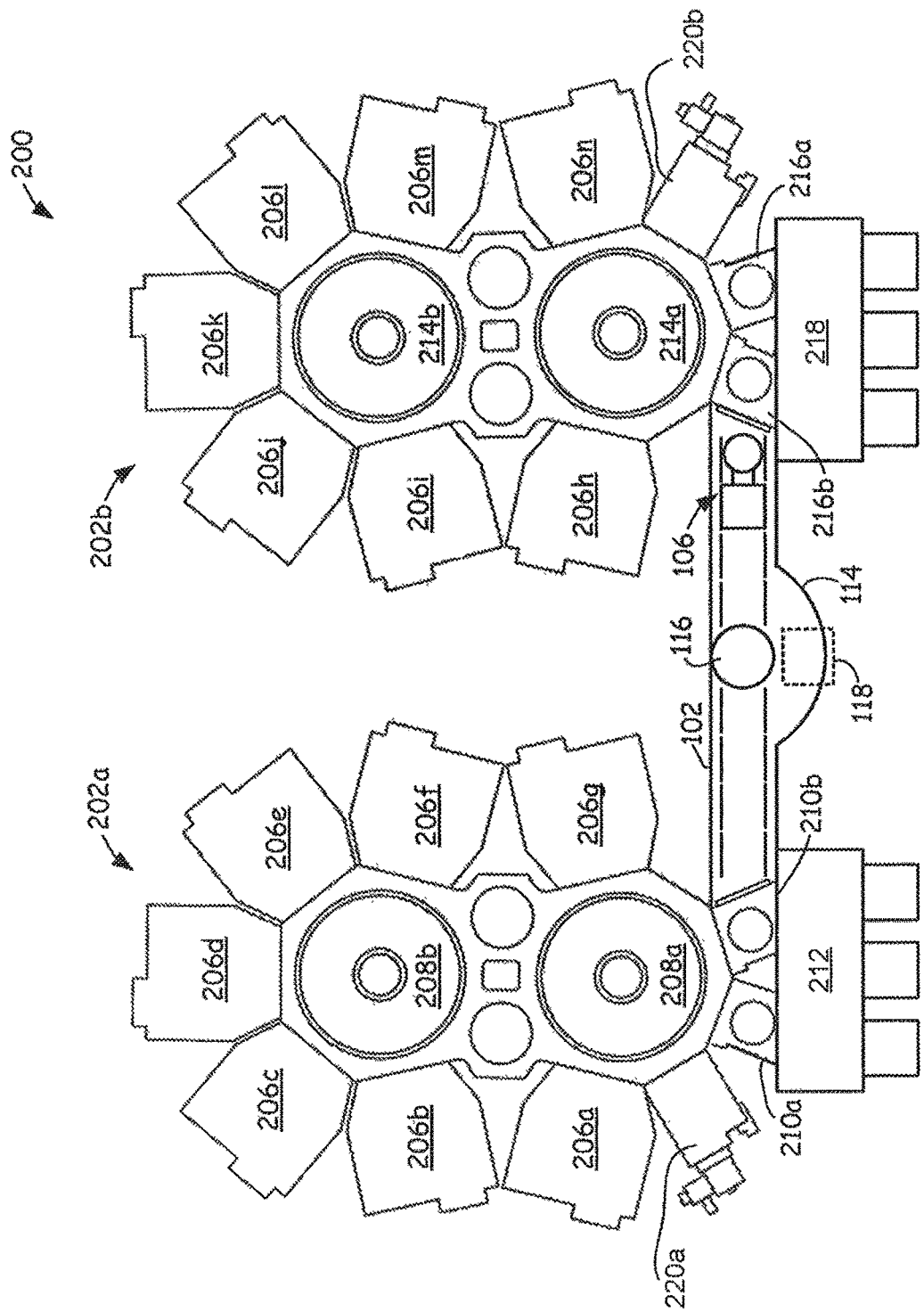
FIG. 2 illustrates a top schematic diagram of a substrate processing and transport (SPT) system, according to one embodiment.

FIG. 2 illustrates a top schematic diagram of a substrate processing and transport (SPT) system 200, according to one embodiment. As shown, the SPT system 200 includes two processing tools 202a, 202b. For example, the processing tools 202a, 202b are Endura 2 systems available from Applied Materials, Inc., or another suitable processing tool (e.g., single or dual transfer chamber processing tools). The SPT system 200 is configured to move substrates between the two processing tools 202a, 202b.

As shown, the processing tool 202a includes processing chambers 206a-g coupled to transfer chambers 208a and 208b, and load lock chambers 210a, 210b coupled between the transfer chamber 208a and an equipment front end module (EFEM) 212. As shown, the processing tool 202b includes processing chambers 202h-n coupled to transfer chambers 214a and 214b, and load lock chambers 216a, 216b coupled between the transfer chamber 214a and EFEM 218. In some embodiments, processing tools 202a and/or 202b include degas and/or preclean chambers 220a, 220b, respectively. Other numbers and/or types of chambers can be used. The processing tools 202a, 202b are configured to move the substrate around the various chambers of the processing tool, allowing the substrate to be processed in each individual processing chamber.

The processing chambers 206a-n can be any type of processing chambers such as deposition chambers (e.g., physical vapor deposition, chemical vapor deposition, plasma enhanced chemical vapor deposition, etc.), etch chambers, degas chambers and/or any other type of processing chambers. Any number of processing chambers 206a-n can perform the same or different processes.

The processing tools 202a, 202b are coupled via the vacuum tunnel 102. For example, the vacuum tunnel 102 couples the load lock chamber 210b of the processing tool 202a to the load lock chamber 216b of the processing tool 202b. In some embodiments, the load lock chamber 210b has a first access opening configured to receive substrates from or supply substrates to the EFEM 212, a second access opening configured to transfer substrates to or from the transfer chamber 208a of the first processing tool 202a, and a third access opening coupled to the vacuum tunnel 102. Likewise, load lock chamber 216b has a first access opening configured to receive substrates from or supply substrates to the EFEM 218, a second opening configured to transfer substrates to or from the transfer chamber 214a of the second processing tool 202b, and a third access opening coupled to the vacuum tunnel 102.

Figure 3:
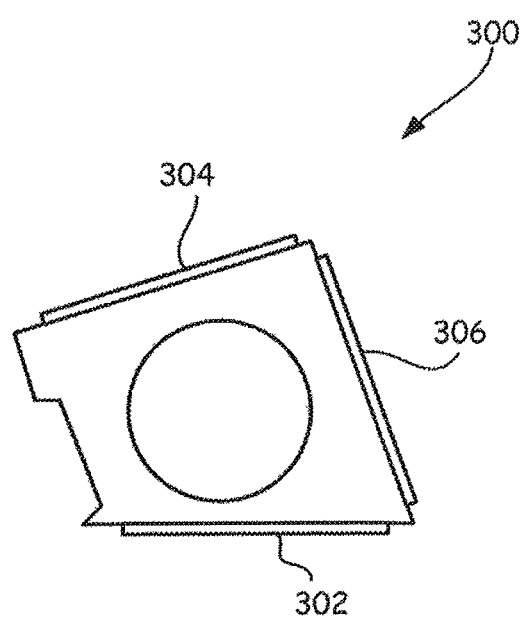
FIG. 3 illustrates a load lock chamber, according to one embodiment.

FIG. 3 illustrates a load lock chamber 300, according to one embodiment. The load lock chamber 300 can be used for either load lock chamber 210b or 216b of FIG. 2. The load lock chamber 300 is configured to receive substrates from the processing tool 202a, 202b. As shown, the load lock chamber 300 includes a first access opening 302 configured to receive substrates from and/or supply substrates to an EFEM (e.g., 212), a second access opening 304 configured to transfer substrates to and/or from a transfer chamber (e.g., 208a), and a third access opening 306 configured to couple to the vacuum tunnel 102.

Returning to FIG. 2, the vacuum tunnel 102 can include expanded region 114 that includes the rotary stage 116. The rotary stage 116 is configured to rotate the substrate transport carriage 106 between about 0 and about 180 degrees. This allows the end effector 110 to be rotated so as to face either the processing tool 202a or the processing tool 202b.

In some embodiments, the metrology tool 118 is positioned relative to the vacuum tunnel 102 so as to allow metrology and/or inspection on a substrate positioned on the end effector 110 while the substrate transport carriage 106 is located in the expanded region 114 and/or rotated by the rotary stage 116. Example metrology tools 118 include tools that measure film thickness, film uniformity, substrate defect level, edge characteristics, etc., as well as a notch finder, a substrate aligner and/or re-orienter, etc., that determines and/or adjusts the alignment/orientation of the substrate as it passes between processing tools 202a, 202b. Vacuum tunnel 102 can transfer substrates between the processing tools 202a, 202b at the same elevation as the processing tools 202a, 202b, or at a different elevation.

Figure 4B:
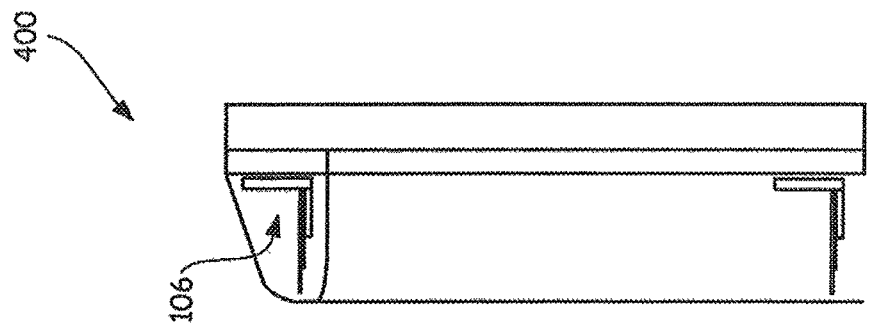
FIG. 4B illustrates a side schematic view of a transport system, according to one embodiment.
Figure 4A:
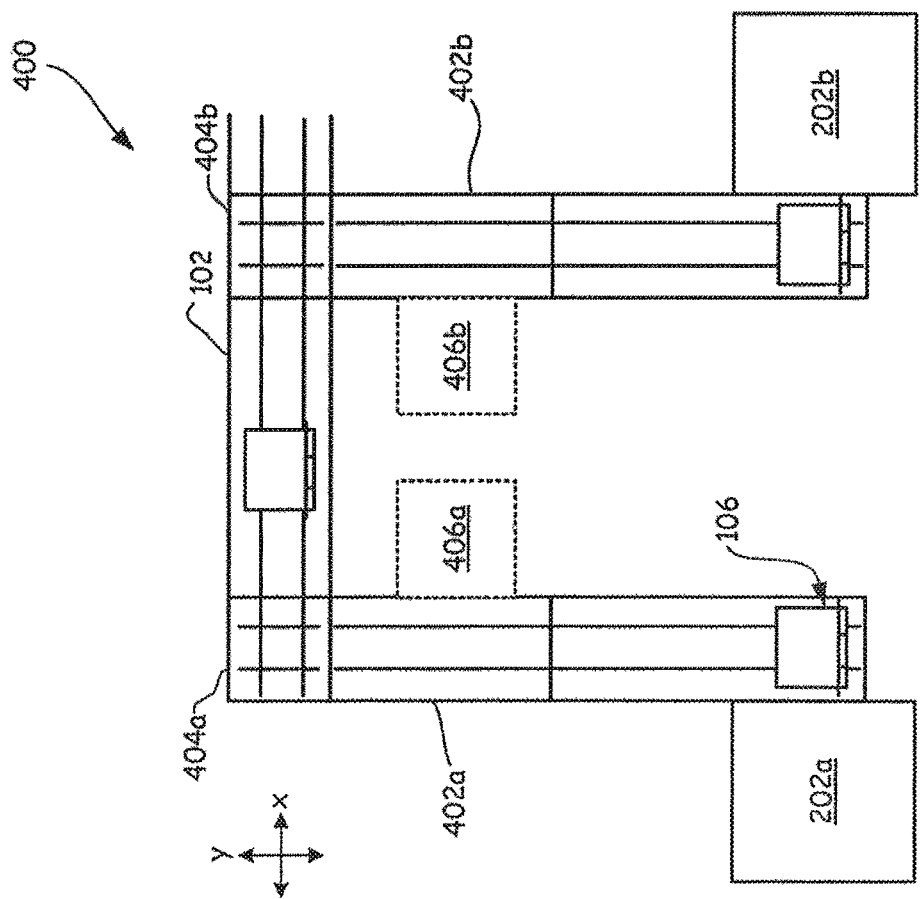
FIG. 4A illustrates a front schematic view of a transport system, according to one embodiment.

FIG. 4A illustrates a front schematic view of a transport system 400, according to one embodiment. FIG. 4B illustrates a side schematic view of the transport system 400, according to one embodiment. The vacuum tunnel 102 is positioned above the processing tools 202a, 202b. An elevator unit 402a can be configured to transfer the substrate transport carriage 106 between the processing tool 202a and the vacuum tunnel 102. Similarly, an elevator unit 402b can be included to transfer the substrate transport carriage 106 between the processing tool 202b and the vacuum tunnel 102. The elevator units 402a, 402b can include a mechanical, maglev or other lift mechanism. As shown, direction change modules 404a, 404b can be configured to change direction of the substrate transport carriage 106 from along the y-axis (vertical) to along the x-axis (horizontal) and/or vice versa (e.g., using a suitable transfer or handoff operation). In some embodiments, the elevator units 402a, 402b and/or direction change modules 404a, 404b are maintained at a similar vacuum level to that of the vacuum tunnel 102.

Figure 4D:
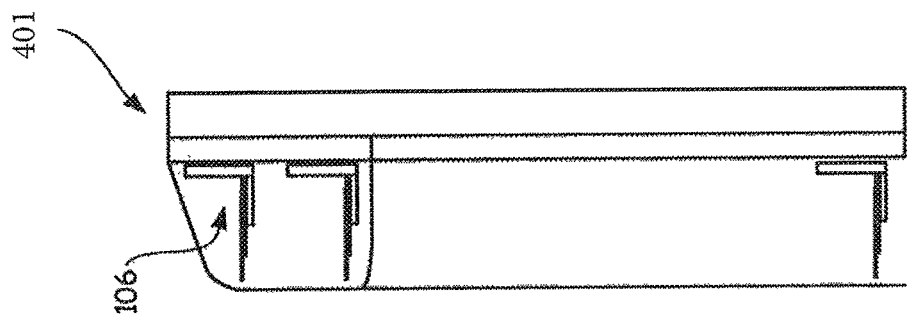
FIG. 4D illustrates a side schematic view of a transport system, according to one embodiment.
Figure 4C:
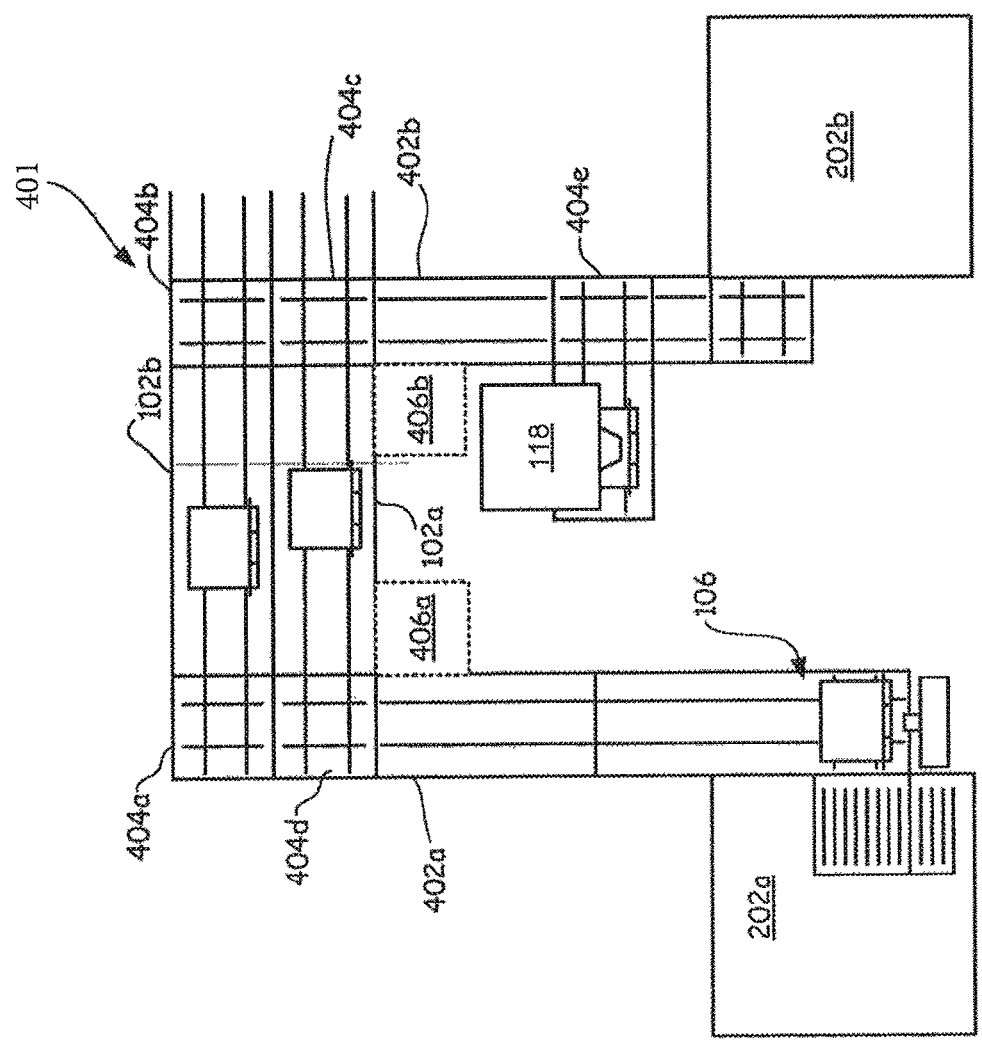
FIG. 4C illustrates a front schematic view of a transport system, according to one embodiment.

FIG. 4C illustrates a front schematic view of a transport system 401, according to one embodiment. FIG. 4D illustrates a side schematic view of the transport system 401, according to one embodiment. The transport system 401 includes stacked vacuum tunnels 102a, 102b at different elevations. The transport system 401 includes a metrology tool 118 within one of the elevator units 402a, 402b. Numerous additional direction change modules 404a-e are shown. Such elevated vacuum tunnels 102a and/or 102b can be included within any of the transport systems described herein. For example, in some embodiments, the load lock chamber 300 (FIG. 3) includes an access opening that allows substrates to be accessed from a top of the load lock chamber 300. Additional stacked and/or elevated vacuum tunnels can be included (e.g., 3, 4, 5, etc., vacuum tunnels).

Returning to FIG. 4A, the elevator unit 402a positioned near the first processing tool 202a allows transport of the substrate transport carriage 106 between the first processing tool 202a and the vacuum tunnel 102. The elevator unit 402b positioned near the second processing tool 202b allows transport of the substrate transport carriage 106 between the second processing tool 202b and the vacuum tunnel 102. In FIGS. 4C and 4D, an additional vacuum tunnel 102b is positioned above the processing tools and is accessible by the first and second elevators units 402a, 402b. The substrate transport carriages 106 also can be configured to support more than one substrate.

Figure 4E:
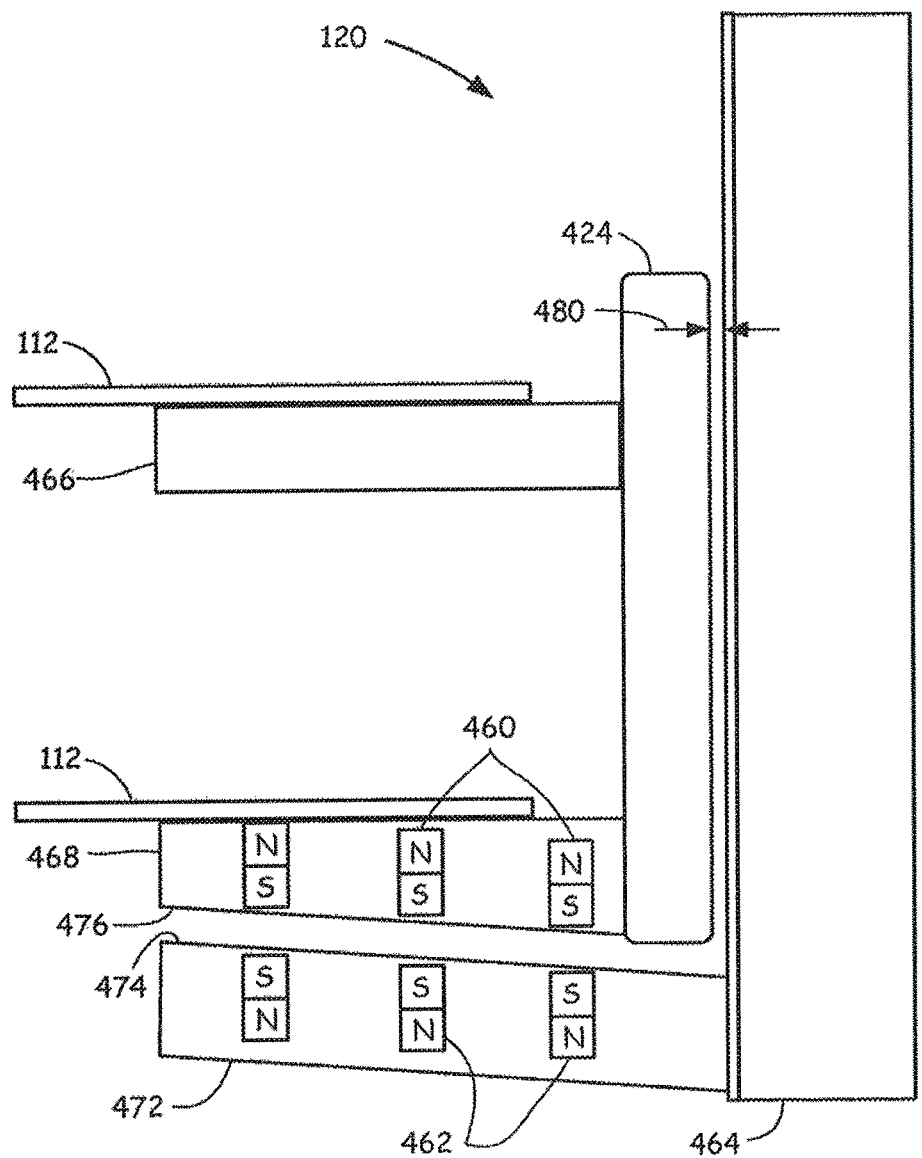
FIG. 4E illustrates a side view of a magnetic levitation system, according to one embodiment.

FIG. 4E illustrates a side view of a magnetic levitation system 120, according to one embodiment. As shown, the magnetic levitation system 120 includes a passive mover 424, including an upper end effector 466 and a lower end effector 468. Fewer or more end effectors can be included, although two end effectors allows a substrate to be retrieved from a load lock or other chamber and another substrate to be placed in the load lock or other chamber quickly. In some embodiments, a plurality of permanent and/or other magnets 460 are located in the lower end effector 468. The magnets 460 are repelled from magnets 462 located in a shelf 472. For example, the shelf 472 is attached to or located in a fixed position relative to a horizontal magnetic levitation track 464. The horizontal magnetic levitation track 464 can include driving coils and position sensors (not shown) to move the passive mover 424 via magnetic forces. In some embodiments, the horizontal magnetic levitation track 464 (and/or driving coils and/or position sensors) are located outside a vacuum area which contains the passive mover 424 and the end effectors 466, 468. For example, the track 464 is in an atmospheric environment.

The shelf 472 includes a top surface 474 that, in some embodiments, intersects the horizontal magnetic levitation track 464 at an angle less than 90° or is parallel to a plane that intersects the horizontal magnetic levitation track 464 at an angle less than 90°. The lower end effector 468 has a lower surface 476 that can be parallel to the top surface 474 of the shelf 472.

In operation, the passive mover 424 is maintained in a vertical position away from the shelf 472 by the magnets 460, 462. The vertical position can be maintained regardless of whether power is supplied to the magnetic levitation system 120. Magnets (not shown) in the passive mover 424 and the horizontal magnetic levitation track 464 maintain a gap 480 between the horizontal magnetic levitation track 464 and the passive mover 424. In the event of power loss, the horizontal magnetic levitation track 464 cannot maintain the gap 480 between the horizontal magnetic levitation track 464 and the passive mover 424. The slope of the top surface 474 and the lower surface 476 then forces the passive mover 424 toward the horizontal magnetic levitation track 464 to where the passive mover 424 contacts the horizontal magnetic levitation track 464 and is prevented from moving (e.g., horizontally) by friction. The passive mover 424 remains vertically supported by magnetic forces.

In some embodiments, the horizontal magnetic levitation track 464 is curved, so long as the gap 480 is maintained to keep the passive mover 424 from binding on the horizontal magnetic levitation track 464.

While the passive mover 424 with the end effectors 466, 468 are supported by a permanent magnetic field, the passive mover 424 can be driven horizontally along the horizontal magnetic levitation track 464 by coils (not shown) behind a maglev separation plate (not shown). These coils do not define the passive mover's vertical position, and only maintain the gap 480 between the track 464 and the passive mover 424, and propel the passive mover 424 horizontally along the track 464. This can allow the horizontal magnetic levitation track 464 to be quite simple and to use less power, as there is reduced or no contact, friction, and battling against gravity.

Returning to FIG. 4A, in some embodiments, the elevator units 402a, 402b include emergency braking systems 406a, 406b configured to prevent the substrate transport carriages within the first or second elevator units 402a, 402b from falling during a loss of electrical power. The emergency braking systems 406a, 406b can be used as a backup or instead of standard uninterrupted power supplies.

Figure 5A:
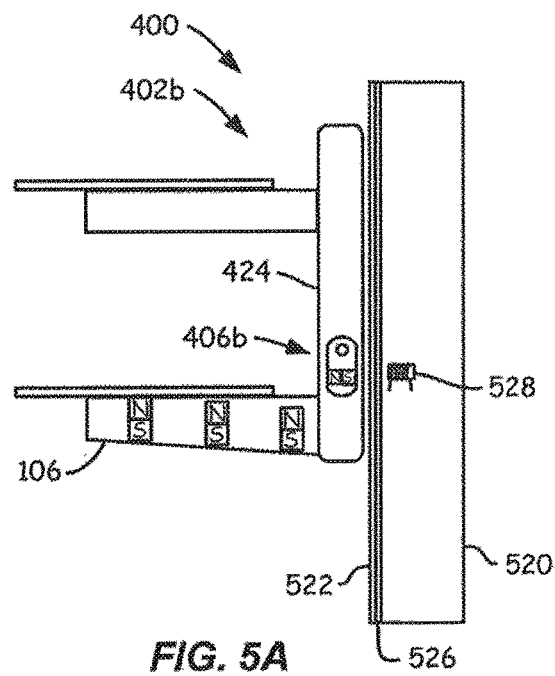
FIG. 5A illustrates a side elevation view of an elevator unit, according to one embodiment.
Figure 5B:
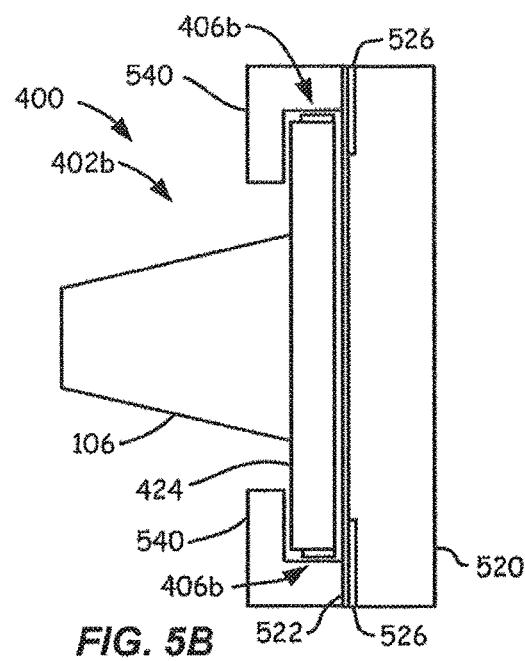
FIG. 5B illustrates a top elevation view of an elevator unit, according to one embodiment.

FIG. 5A illustrates a side elevation view of the elevator unit 402b, according to one embodiment. FIG. 5B illustrates a top elevation view of the elevator unit 402b, according to one embodiment. The second elevator unit 402b is shown in an unlocked state. As shown, the second elevator unit 402b includes a linear motor 520 that is configured to raise and lower the passive mover 424 coupled to the substrate transport carriage 106. In some embodiments, the passive mover 424 is a passive device without any electronic devices located therein. The emergency braking system 406b can prevent the passive mover 424 from freefalling should the linear motor 520 become dysfunctional. The first elevator unit 402a can have similar locked and unlocked state.

The emergency braking system 406b can include a friction surface 522 located on the linear motor 520, or the friction surface 522 can be located proximate the linear motor 520. A strip 526 can extend the length of the second elevator unit 402b and can be configured to be magnetized by an electromagnet 528. For example, an outer face of the strip 526 is polarized in response to the electromagnet 528 being energized. For example, the outer surface of the strip 526 is polarized south when the electromagnet 528 is energized. The opposite polarity can be used.

Figure 5C:
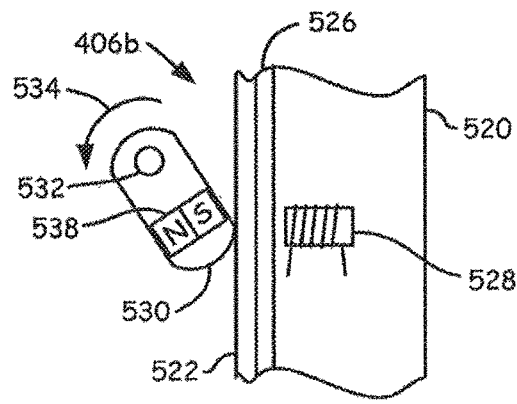
FIGS. 5C and 5D illustrate enlarged views of a tab, according to one embodiment.
Figure 5D:
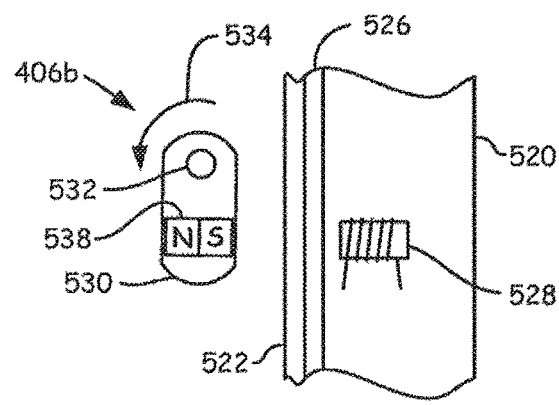

FIGS. 5C and 5D illustrate enlarged views of a tab 530, according to one embodiment. The tab 530 is included in the braking system 406b. The tab 530 can be pivotable relative to the passive mover 424 about a pivot point 532. The tab 530 can be biased in a counterclockwise direction 534 about the pivot point 532 (e.g., via a spring or other tensioning device, not shown). Accordingly, a lower portion of the tab 530 is biased toward the friction surface 522. The tab 530 can include a permanent magnet 538 having a pole facing the strip 526 that is the same polarity as the polarity as the strip 526 when the strip is magnetized by the electromagnet 528.

While two emergency braking systems 406b are illustrated in FIG. 5B, one located on each side of passive mover 424, it will be understood that fewer or more emergency braking systems may be used.

In operation, the electromagnet 528 can be energized from a source that operates the linear motor 520. The energized electromagnet 528 magnetizes the strip 526, which repels the magnet 538 and forces the tab 530 to pivot opposite the direction 534, as illustrated in FIG. 5D. In such a configuration, the second elevator unit 402b is in an unlocked state and the substrate transport carriage 106 can be freely raised or lowered. When power is lost to the linear motor 520, the electromagnet 528 cannot magnetize the strip 526, so the tab 530 rotates counterclockwise into the friction surface 522 as shown in FIG. 5C. The contact of the tab 530 with the friction surface 522 locks the second elevator unit 402b and prevents the passive mover 424 from falling. Braces 540 can prevent the passive mover 424 from falling or moving away from the linear motor 520 when the tab 530 contacts the friction surface 522.

Figure 6:
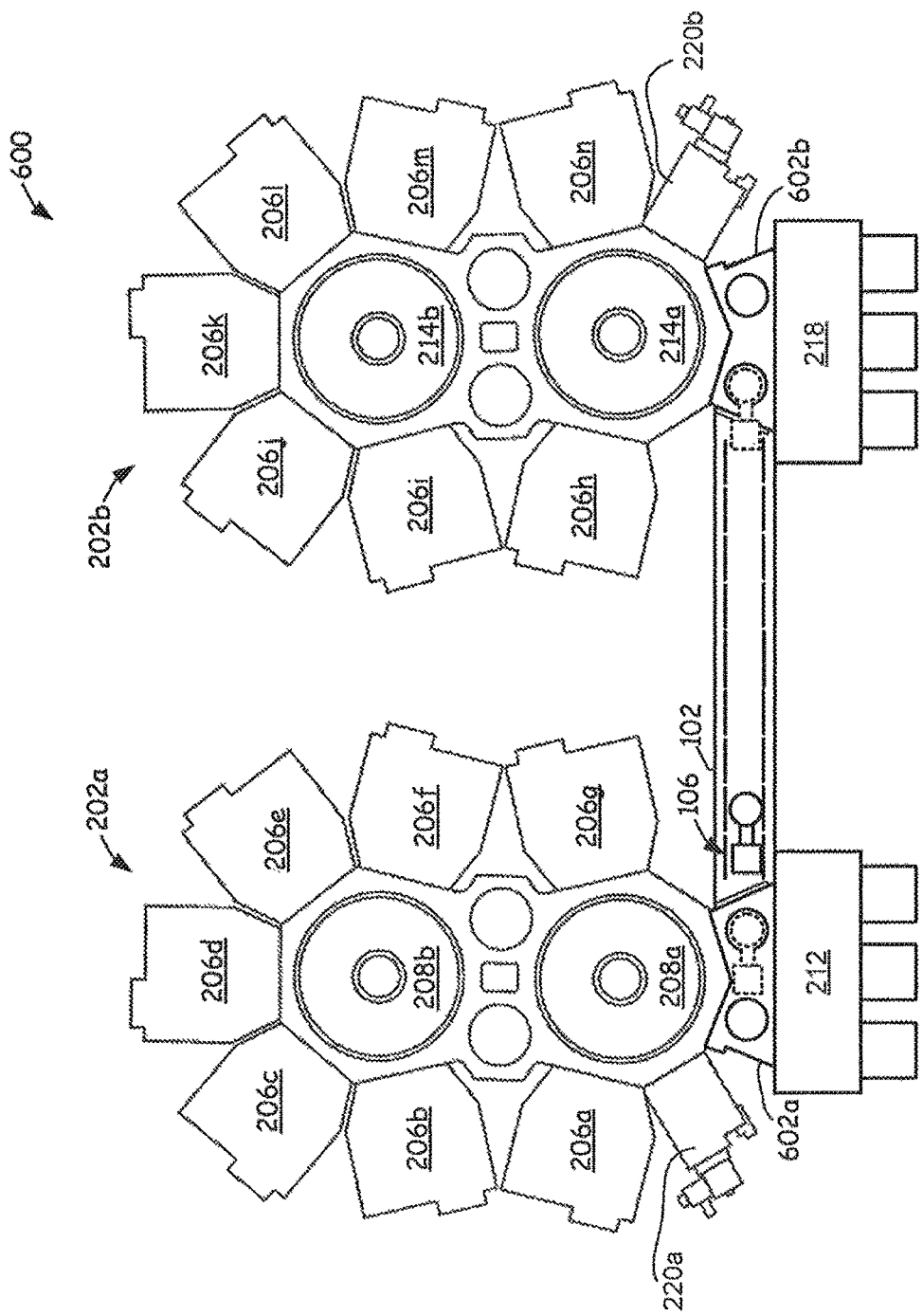
FIG. 6 illustrates a top schematic diagram of a SPT system, according to one embodiment.

FIG. 6 illustrates a top schematic diagram of a SPT system 60, according to one embodiment. The SPT system 600 is similar to the SPT system 200, but the SPT system 600 includes a double load lock chamber 602a with the processing tool 202a. Additionally, the vacuum tunnel 102 does not include an expanded region or rotary stage. The double load lock chamber 602a is sized to allow the substrate transport carriage 106 to extend into the double load lock chamber 602a so that a robot within transfer chamber 208a can retrieve a substrate from (or place a substrate on) the substrate transport carriage 106. For example, an interior region of the double load lock chamber 602a has sufficient space to allow the substrate transport carriage 106 to travel therein a sufficient distance for a substrate to be retrieved from the substrate transport carriage 106. In some embodiments, the load lock chamber 602a includes a mechanism for allowing the substrate transport carriage 106 to move therein (e.g., a maglev track or another movement mechanism). In this manner, no rotation is employed when transporting substrates between processing tools 202a and 202b. In some embodiments, a double load lock chamber 602b is similarly configured as the double load lock chamber 602a, although single load lock chambers can be used with processing tool 202b.

Figure 7:
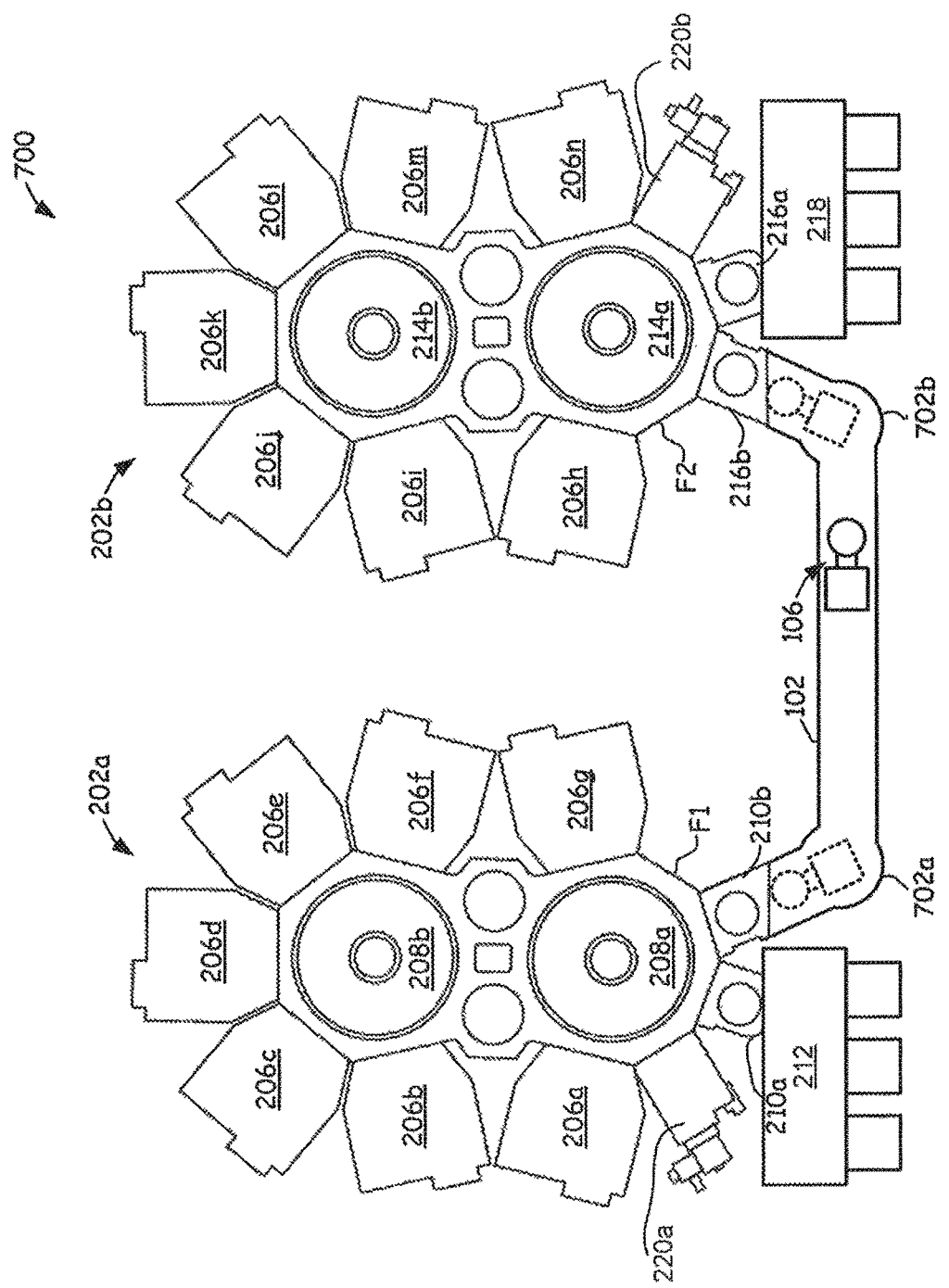
FIG. 7 illustrates a top schematic diagram of a SPT system, according to one embodiment.

FIG. 7 illustrates a top schematic diagram of a SPT system 700, according to one embodiment. The SPT system 700 is similar to the SPT system 200, but in the SPT system 700 the EFEM 212 is moved to provide access to load lock chamber 210b, and the EFEM 218 is moved to provide access to load lock chamber 216b. In this manner, the vacuum tunnel 102 extends between a front access opening of the load lock chamber 210b and a front access opening of the load lock chamber 216b. In some embodiments, two rotary stages 702a and 702b are provided for allowing substrate transport carriage 106 to be oriented for placement or retrieval of substrates from either load lock chamber 210b or load lock chamber 216b (as shown in phantom). Such a configuration provides sufficient room for an additional facet F1 and F2 of processing tools 202a and 202b, respectively, to be employed. The additional facets F1, F2 allow the processing tools 202a, 202b to accommodate an additional processing chamber.

Figure 8:
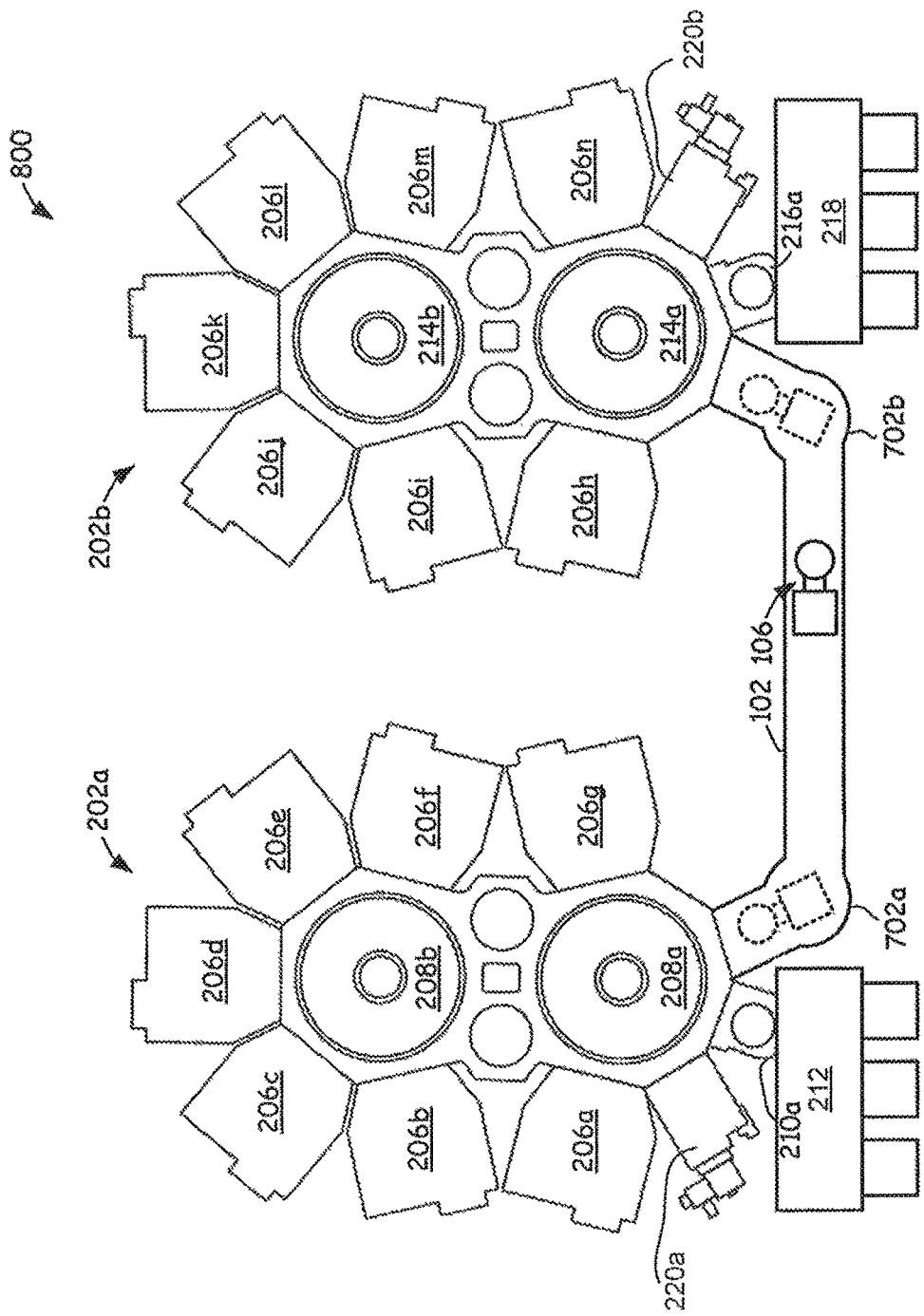
FIG. 8 illustrates a top schematic diagram of a SPT system, according to one embodiment.

FIG. 8 illustrates a top schematic diagram of a SPT system 800, according to one embodiment. The SPT system 800 is similar to the SPT system 700, but in the SPT system 700 the load lock chambers 210b and 201b are removed (e.g., to provide a more compact layout). Instead, the SPT system 800 includes only a single load lock chamber 210a, 210b for each processing tool 202a, 202b. The vacuum tunnel 102 interfaces directly with the transfer chambers 208a, 208b.

Figure 9:
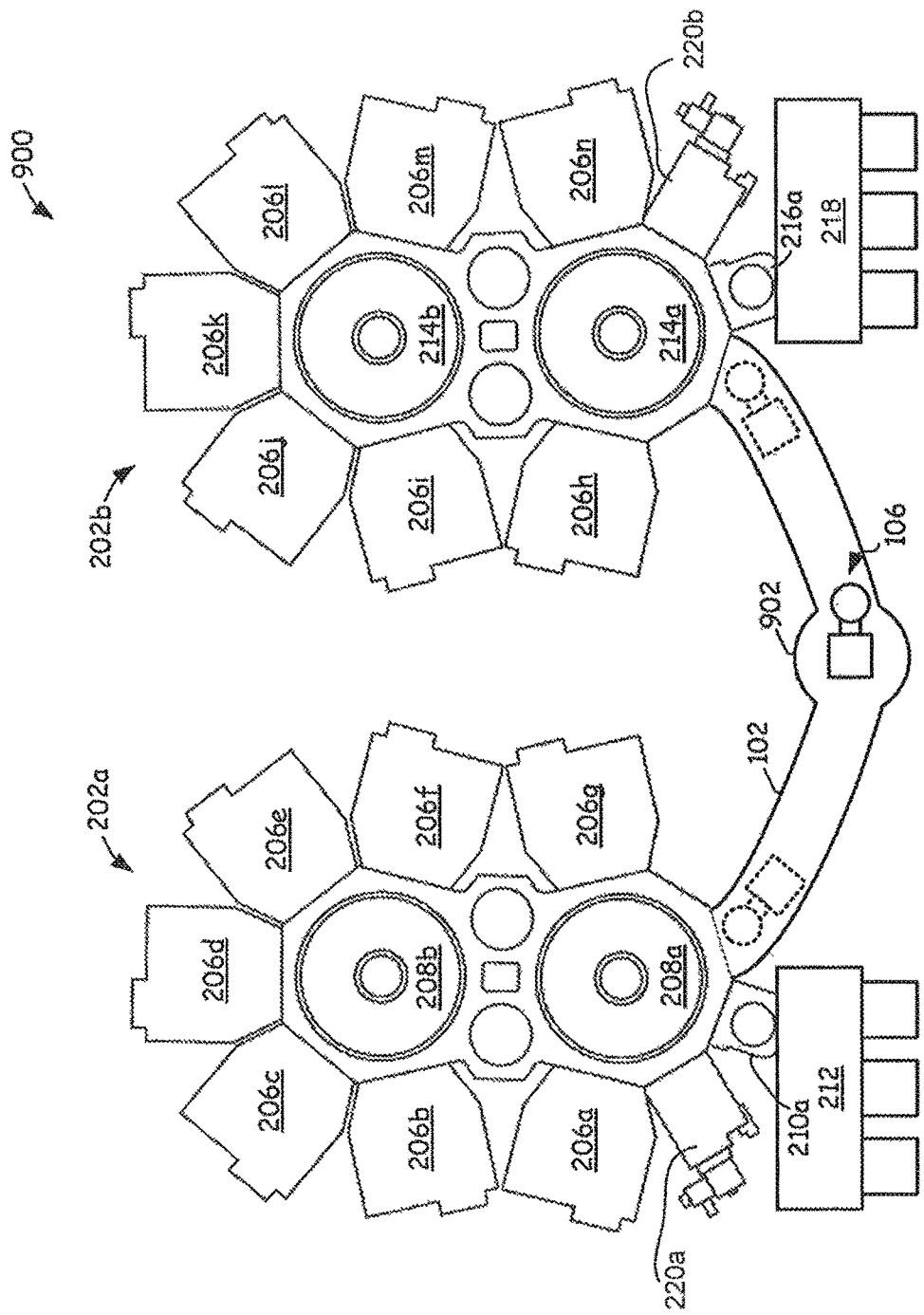
FIG. 9 illustrates a top schematic diagram of a SPT system, according to one embodiment.

FIG. 9 illustrates a top schematic diagram of a SPT system 900, according to one embodiment. The SPT system 900 is similar to the SPT system 800, but the SPT system 900 includes a curved path within the vacuum tunnel 102. Because the vacuum tunnel 102 is curved, a single rotary stage 902 is used for re-orienting the substrate transport carriage 106 when performing substrate transfers between the processing tools 202a and 202b.

Figure 10:
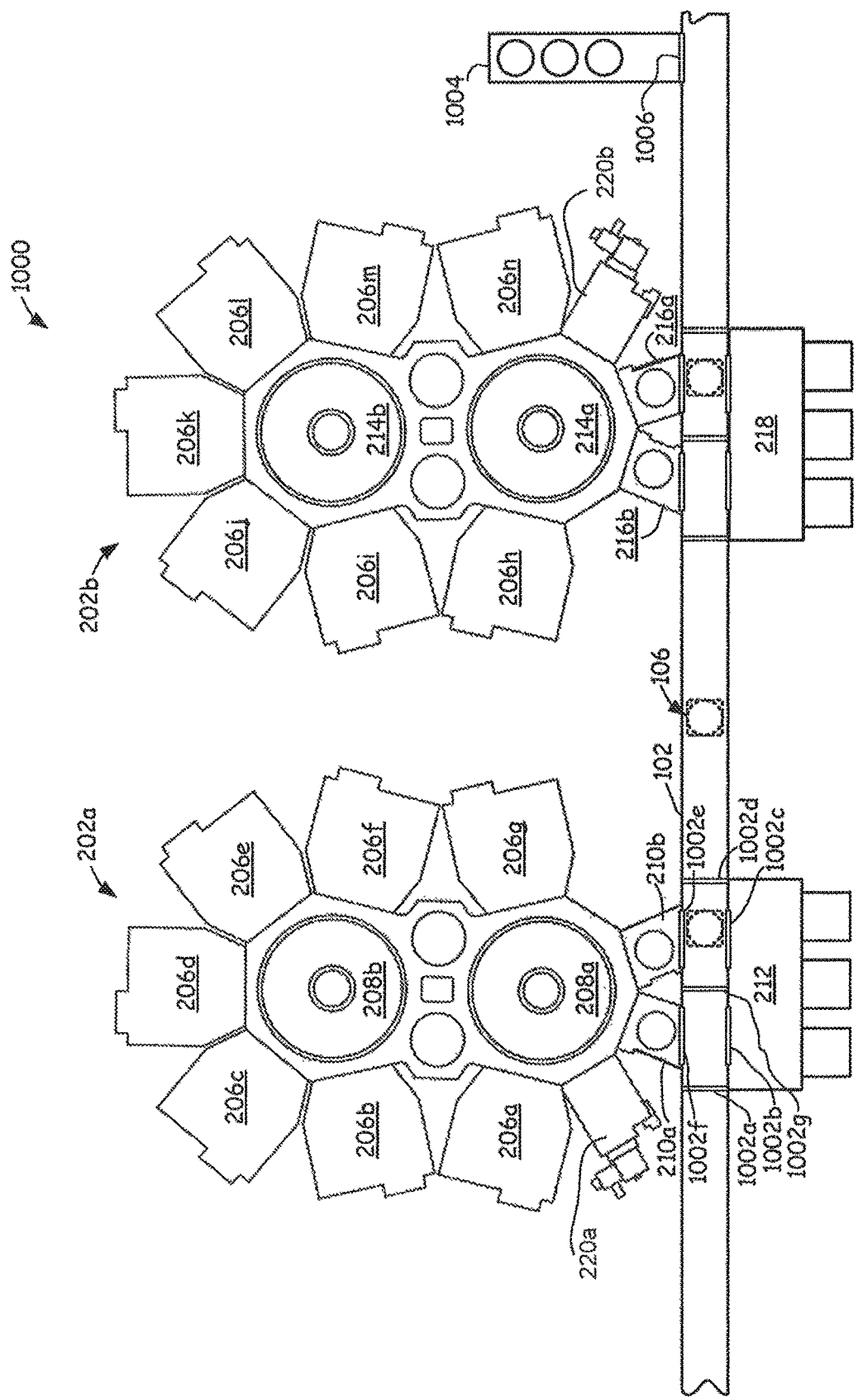
FIG. 10 illustrates a top schematic diagram of a SPT system, according to one embodiment.

FIG. 10 illustrates a top schematic diagram of a SPT system 1000, according to one embodiment. The vacuum tunnel 102 is configured to extend linearly between two or more processing tools (e.g., at least processing tools 202a and 202b). As with the SPT system 600 of FIG. 6, the SPT system 1000 does not include a rotary stage.

The vacuum tunnel 102 is positioned between the load lock chambers 210a, 210b and the EFEM 212 of processing tool 202a, and between the load lock chambers 216a, 216b and the EFEM 218 of the processing tool 202b. The substrate transfers into the vacuum tunnel 102 near the processing tool 202a using either a robot within the EFEM 212 or a robot within the transfer chamber 208a. For example, a robot within the transfer chamber 208a picks up or places a substrate within the vacuum tunnel 102 by extending through either load lock chamber 210a or 210b. Isolation valves 1002a-1002g allow portions of the vacuum tunnel 102 to be isolated during substrate transfers, particularly when substrates are being transferred between the EFEM 212 and the vacuum tunnel 102, because the EFEM 212 typically is not operated at a vacuum level. The isolation valves 1002a-1002g prevent the remainder of the vacuum tunnel 102 and/or the load lock chambers 210a, 210b from being exposed to an atmospheric pressure environment within the EFEM 212. The vacuum tunnel 102 can be similarly configured with isolation valves (not shown) near the processing tool 202b to allow substrate transfers between the vacuum tunnel 102, the load lock chambers 216a, 216b, and the EFEM 218.

An advantage of the SPT system 1000 is that no rotation is employed when moving between processing tools 202a, 202b. Additionally, the substrate transport carriage 106 is simplified in some embodiments, since the substrate transport carriage does not extend into the processing tools 202a, 202b during pick and place operations. Instead, robots within the EFEMs 212, 218 or the transfer chambers 208a, 214a enter the vacuum tunnel 102. Further, any number of processing tools can be interconnected using the vacuum tunnel 102. The substrate transport carriage 106 does not include an end effector (although an end effector can be used).

In some embodiments, the load lock chambers 210a, 210b, 216a, 216b are used for pre-heating, cooling, metrology, inspection, and/or the like, or replaced with such chambers, as the vacuum tunnel 102 effectively serves as the load lock chambers.

In some embodiments, one or more supplemental substrate buffer locations 1004 are included, and the supplemental substrate buffer locations are configured to store substrates. For example, an isolation valve 1006 is employed to isolate substrates from vacuum tunnel 102. Substrate buffer locations 1004 can be in the same plane as the vacuum tunnel 102, perpendicular to the vacuum tunnel 102, vertically oriented, or the like.

As described above, a transport system and a SPT system are provided. The SPT system includes a transport system that connects two processing tools. The transport system includes a vacuum tunnel that is configured to transport substrates between the processing tools. The vacuum tunnel includes a substrate transport carriage to move the substrate through the vacuum tunnel.

The SPT system has a variety of configurations that allow the user to add or remove processing chambers, depending on the process chambers required for a desired substrate processing procedure. One or more vacuum tunnels can be included, allowing the possibility of transferring multiple substrates. Elevator units with braking systems prevent damage to substrates and components of the SPT system in case of power failure.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A transport system, comprising:
    a vacuum tunnel configured to interface with a first processing tool and a second processing tool, the vacuum tunnel comprising:
        an expanded region;
        a substrate transport carriage, comprising:
            a carriage body; and
            an end effector coupled to the carriage body, the end effector configured to support a substrate during transport within the vacuum tunnel, the end effector configured to extend into the first or second processing tool to extract or place the substrate while the carriage body remains within the vacuum tunnel;
        a rotary stage disposed in the expanded region, the rotary stage configured to rotate the substrate transport carriage between about 0 degrees and about 180 degrees; and
        a metrology tool, wherein the metrology tool is configured to perform metrology on the substrate positioned on the end effector while the substrate transport carriage is located within the expanded region.

2. The transport system of claim 1, further comprising a magnetic levitation system configured to levitate the substrate transport carriage and move the substrate transport carriage between the first and second processing tools.

3. The transport system of claim 1, further comprising:
    a first elevator unit positioned near the first processing tool so as to allow transport of the substrate transport carriage between the first processing tool and the vacuum tunnel; and
    a second elevator unit positioned near the second processing tool so as to allow transport of the substrate transport carriage between the second processing tool and the vacuum tunnel,
    wherein the vacuum tunnel is positioned above the first and second processing tools.

4. The transport system of claim 3, further comprising an additional vacuum tunnel positioned above the first and second processing tools, the vacuum tunnel accessible by the first and second elevators units.

5. The transport system of claim 3, further comprising an emergency braking system configured to prevent the substrate transport carriage within the first or second elevator units from falling during a loss of electrical power.

6. A substrate processing and transport (SPT) system, comprising:
    a first processing tool and a second processing tool each comprising:
        a transfer chamber configured to couple to one or more processing chambers;
        a load lock chamber having a first access opening, wherein the load lock chamber is configured to receive a substrate via the first access opening from an equipment front end module;
        a second access opening configured to allow transfer of substrates to or from the transfer chamber of the first processing tool; and
        a third access opening; and
    a vacuum tunnel coupled between the third access opening of the first processing tool and the third access opening of the second processing tool, the vacuum tunnel comprising a substrate transport carriage comprising:
        a carriage body; and
        an end effector coupled to the carriage body, the end effector configured to support the substrate during transport within the vacuum tunnel and to extend into the load lock chambers of the first and second processing tools using the third access opening of each of the first and second processing tools.

7. The SPT system of claim 6, the vacuum tunnel further comprising a second rotary stage.

8. The SPT system of claim 6, further comprising a magnetic levitation system configured to levitate the substrate transport carriage and move the substrate transport carriage between the first and second processing tools.

9. The SPT system of claim 6, wherein the vacuum tunnel further comprises:
    an expanded region, the substrate transport carriage disposed in the expanded region; and
    a rotary stage disposed in the expanded region, the rotary stage configured to rotate the substrate transport carriage between about 0 degrees and about 180 degrees.

10. The SPT system of claim 9, further comprising a metrology tool positioned relative to the vacuum tunnel so as to allow metrology on the substrate positioned on the end effector while the substrate transport carriage is rotated by the rotary stage.

11. The SPT system of claim 9, wherein the vacuum tunnel further comprises a curved path.

12. The SPT system of claim 6, further comprising a plurality of isolation valves, wherein each of the isolation valves of the plurality of isolation valves are disposed between the vacuum tunnel and the load lock chambers of the first and second processing tools.

13. A transport system comprising:
    a vacuum tunnel configured to extend between a first processing tool and a second processing tool, wherein the vacuum tunnel is positioned above the first and second processing tools, the vacuum tunnel comprising a substrate transport carriage;
    a first elevator unit positioned near the first processing tool so as to allow transport of the substrate transport carriage between the first processing tool and the vacuum tunnel;
    a second elevator unit positioned near the second processing tool so as to allow transport of the substrate transport carriage between the first processing tool and the vacuum tunnel; and an emergency braking system configured to prevent substrate transport carriage systems within the first or second elevator units from falling during a loss of electrical power.

14. The transport system of claim 13, wherein the substrate transport carriage comprises:
a carriage body; and
an end effector coupled to the carriage body, the end effector configured to support a substrate during transport within the vacuum tunnel.

15. The transport system of claim 13, wherein the vacuum tunnel further comprises:
an expanded region, the substrate transport carriage disposed in the expanded region; and
a rotary stage disposed in the expanded region, the rotary stage configured to rotate the substrate transport carriage between about 0 degrees and about 180 degrees.

16. The transport system of claim 15, wherein the vacuum tunnel further comprises a metrology tool, wherein the metrology tool is configured to perform metrology on a substrate positioned on an end effector while the substrate transport carriage is located within the expanded region.

17. The transport system of claim 15, the vacuum tunnel further comprising a second rotary stage disposed in the expanded region.

18. The transport system of claim 13, further comprising a magnetic levitation system configured to levitate the substrate transport carriage and move the substrate transport carriage between the first and second processing tools.

19. The transport system of claim 13, wherein at least one of the first and second elevator units includes a magnetic lift mechanism.

20. A transport system, comprising:
a vacuum tunnel configured to interface with a first processing tool and a second processing tool, the vacuum tunnel comprising:
an expanded region;
a substrate transport carriage, comprising:
a carriage body; and
an end effector coupled to the carriage body, the end effector configured to support a substrate during transport within the vacuum tunnel, the end effector configured to extend into the first or second processing tool to extract or place the substrate while the carriage body remains within the vacuum tunnel;
a rotary stage disposed in the expanded region, the rotary stage configured to rotate the substrate transport carriage between about 0 degrees and about 180 degrees;
a first elevator unit positioned near the first processing tool so as to allow transport of the substrate transport carriage between the first processing tool and the vacuum tunnel; and
a second elevator unit positioned near the second processing tool so as to allow transport of the substrate transport carriage between the second processing tool and the vacuum tunnel,
wherein the vacuum tunnel is positioned above the first and second processing tools.

* * * * *